(12) United States Patent
Tolia et al.

(10) Patent No.: US 6,305,392 B1
(45) Date of Patent: Oct. 23, 2001

(54) METHOD AND APPARATUS FOR REMOVING PROCESSING LIQUID FROM A PROCESSING LIQUID DELIVERY LINE

(75) Inventors: Anish Tolia, San Jose; Tushar Mandrekar, Santa Clara; Michael Jackson, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/252,717

(22) Filed: Feb. 19, 1999

(51) Int. Cl.[7] ................................................. B08B 9/027
(52) U.S. Cl. ............................. 134/169 C; 15/104.03; 15/104.05; 137/238; 137/240; 137/242
(58) Field of Search .......................... 134/166 C, 169 C, 134/169 R, 184, 22.11, 22.12; 15/304, 104.03, 104.05, 104.07; 137/238, 240, 242; 366/114, 127

(56) References Cited

U.S. PATENT DOCUMENTS

| | | | |
|---|---|---|---|
| 3,175,567 | * 3/1965 | Crawford | 134/169 C |
| 3,409,031 | * 11/1968 | Benbow et al. | 134/169 C |
| 4,762,668 | * 8/1988 | Loose et al. | 15/104.07 X |
| 4,893,361 | * 1/1990 | Burns | 134/169 C X |
| 5,085,244 | * 2/1992 | Funk | 134/169 C X |
| 5,123,433 | * 6/1992 | Fridsma et al. | 134/166 C X |
| 5,395,592 | * 3/1995 | Bolleman et al. | 366/127 X |
| 5,749,389 | * 5/1998 | Ritrosi et al. | 134/169 C X |

FOREIGN PATENT DOCUMENTS

| | | | |
|---|---|---|---|
| 3714578 | * 11/1987 | (DE) | 15/104.05 |
| 2330284 | * 5/1977 | (FR) | 137/242 |

* cited by examiner

*Primary Examiner*—Philip R. Coe
(74) *Attorney, Agent, or Firm*—Dugan & Duan

(57) ABSTRACT

A method and apparatus for desorbing processing liquid from a processing liquid delivery line is provided. Non-thermal energy, such as ultrasonic energy or electromagnetic energy, is applied to a processing liquid delivery line. The non-thermal energy may be applied directly to the processing liquid delivery line, or may be applied indirectly via a conducting medium which distributes the energy along the length of the processing liquid delivery line. When non-thermal energy in the form of electromagnetic energy is employed, the frequency of the electromagnetic energy is adjusted to match the vibrational frequency of the absorbed molecules of processing liquid.

13 Claims, 3 Drawing Sheets

METHOD AND APPARATUS FOR REMOVING PROCESSING LIQUID FROM A PROCESSING LIQUID DELIVERY LINE

FIELD OF THE INVENTION

The present invention relates to processing liquid delivery systems for processing chambers, and more specifically to the removal of processing liquid from a processing liquid delivery line of a processing liquid delivery system.

BACKGROUND OF THE INVENTION

Many semiconductor processes such as chemical vapor deposition (CVD) employ vaporized processing liquids. These vaporized processing liquids are generated and supplied to a processing chamber via a processing liquid delivery system comprising an interconnection of pipes, valves, flow regulators and vaporizing mechanisms. Typically a separate vaporizing mechanism is provided for vaporizing each processing liquid, and is coupled to a source of processing liquid and a source of carrier gas. Although a number of vaporizing mechanisms exist (e.g., bubblers, injection valves, etc.), most conventional processing liquid delivery systems employ a plurality of injection valves for vaporizing processing liquids to be delivered to a processing chamber.

A typical injection valve comprises a processing liquid inlet for receiving a pressurized processing liquid, a carrier gas inlet for receiving a pressurized inert carrier gas, and an outlet for delivering a vaporized processing liquid/carrier gas mixture. The injection valve is heated such that when the processing liquid is injected into the carrier gas, the heat and the pressure difference between the two sides of the injection valve cause the processing liquid to vaporize.

Over time injection valves may clog or fail (e.g., due to deposit formation within the injection valve from the interaction of processing liquid with other processing chemicals or with the injection valve itself) and must be replaced. However, the process of injection valve replacement is complicated when the processing liquid vaporized by the injection valve reacts deleteriously with air (e.g., with moisture, oxygen, etc.) to form by-products (e.g., solid films such as oxides) that can damage the processing liquid delivery system or the processing chamber, contaminate subsequently processed semiconductor wafers or harm humans or the environment (e.g., are toxic).

To prevent deleterious processing liquid formation during injection valve replacement, if possible, processing liquid is purged from all processing liquid delivery lines that will be exposed to atmosphere when the clogged injection valve is removed. However, as described with reference to FIG. 1, within conventional processing liquid delivery systems the purging process is difficult, particularly when processing liquids with strong adhesive properties such as metal-organics (e.g., tetrakis(dimethylamino)titanium (TDMAT)) must be purged from processing liquid delivery lines.

FIG. 1 is schematic view of a conventional processing liquid delivery system 11 ("conventional system 11") for delivering vaporized processing liquid to a processing chamber 12. The conventional system 11 comprises a source of processing liquid 13 operatively coupled (i.e., coupled either directly or indirectly so as to operate) to an injection valve 15 via a processing liquid delivery line 17. Note that the processing liquid delivery line 17 is shown broken to indicate that the source of processing liquid 13 may be a substantial distance (e.g., about 10–15 feet) from the injection valve 15.

Disposed along and forming a part of the processing liquid delivery line 17 are a first isolation valve 19, a second isolation valve 21, a liquid flow meter 23 and a third isolation valve 25. The first isolation valve 19 is positioned near the source of processing liquid 13, the third isolation valve 25 is positioned near the injection valve 15, the liquid flow meter 23 is positioned near the third isolation valve 25, and the second isolation valve 21 is positioned near the liquid flow meter 23, as shown. A large number of other isolation valves typically are present along the processing liquid delivery line 17 but are omitted for clarity.

The conventional system 11 also comprises a source of purging gas 27 (e.g., nitrogen, argon, or some other gas which does not react with the processing liquid) operatively coupled to the processing liquid delivery line 17 via a purging gas line 29, and a pump 31 (e.g., a mechanical pump) operatively coupled to the processing liquid delivery line 17 via a pump line 33. Disposed along and forming a part of the purging gas line 29 is a purge valve 35, and disposed along and forming a part of the pump line 33 is a pump valve 37.

During normal operation of the conventional system 11, the first isolation valve 19, the second isolation valve 21 and the third isolation valve 25 are open to allow processing liquid to flow from the source of processing liquid 13 to the injection valve 15 at a rate controlled by the liquid flow meter 23. The purge valve 35 and the pump valve 37 are closed to prevent processing liquid from being purged by the source of purging gas 27 and from being pumped by the pump 31.

If the injection valve 15 subsequently becomes clogged and must be replaced, the injection valve 15 is isolated from the source of processing liquid 13 by closing the first isolation valve 19. Assuming the processing liquid is a metal-organic substance such as TDMAT, the injection valve 15 cannot be directly disconnected from the conventional system 11 without posing a substantial health risk to the technician removing the injection valve 15 and without posing a substantial damage risk to the conventional system 11. TDMAT, for instance, reacts with moisture in the air to form by-products that are harmful to humans (e.g. amines) and solid films (e.g., oxides) that will contaminate the entire conventional system 11. Processing liquid, therefore, must be purged from the processing liquid delivery line 17 prior to removing the injection valve 15.

To purge processing liquid from the processing liquid delivery line 17, while the first isolation valve 19 is closed and the second isolation valve 21 and the third isolation valve 25 are open, the purge valve 35 and the pump valve 37 are opened. Purging gas thereby flows from the source of purging gas 27, through the purging gas line 29, through the processing liquid delivery line 17 and through the pump line 33 to the pump 31. The purging gas dislodges processing liquid particles from the surfaces of the processing liquid delivery line 17, and the dislodged particles are pumped from the processing liquid delivery line 17 via the pump 31. Pump/purge cycles (wherein the purge valve 35 is closed for a time period while the pump 31 continues to pump processing liquid and purging gas from he processing liquid delivery line 17, followed by a time period wherein the purge valve 35 is opened so as to introduce more purging gas to the processing liquid delivery line 17) may be performed to aid in processing liquid removal from the processing liquid delivery line 17.

For processing liquids having strong adhesive properties (e.g., metal-organics), the pump/purge process described above does not effectively removing processing liquid from the processing liquid delivery line 17 to a level sufficient to prevent deleterious by-product formation when the injection valve 15 is disconnected from the conventional system 11. This is particularly true for TDMAT.

One approach to improving the purging effectiveness of the conventional system 11 is to employ thermal methods which heat the relevant processing liquid path to desorb processing liquid therefrom. Thermal methods, however, can damage rubber parts (e.g., valve seats), and can lead to decomposition of the processing liquid, generating particles and the problems associated therewith. Rubber parts, with added expense, can be designed to withstand thermal desorption temperatures. Decomposition, on the other hand, is unavoidable because processing liquid desorption and processing liquid decomposition may occur in the same temperature range. Many semiconductor processing liquids such as (TDMAT, dimethyl aluminum hydride (DMAH), (Trimethylvinylsilyl)hexafluoroacetylacetonato Copper 1 (CupraSelect®), etc.) deposit metal constituents as they decompose. The deposited metal may clog the processing liquid delivery line or clog downstream valves, and thus may further increase downtime costs. Even if clogging does not result, metals deposited in the processing liquid delivery line can flake therefrom, contaminating the processing chamber and potentially destroying any wafers being processed therein.

Accordingly, a need exists for a processing liquid purging method and apparatus that more effectively purges a processing liquid from a processing liquid delivery system without causing processing liquid decomposition and its attendant problems.

SUMMARY OF THE INVENTION

The present invention operatively couples a source of non-thermal energy (e.g., ultrasonic energy, electromagnetic energy, etc.) to a processing liquid delivery line from which processing liquid must be desorbed. The non-thermal energy source provides the energy required to desorb liquid molecules from the processing liquid delivery line. This non-thermal energy is transmitted from the source to the processing liquid delivery line where the non-thermal energy affects processing liquid desorption without decomposing the processing liquid, and without harming rubber components.

The non-thermal energy may be coupled directly to the processing liquid delivery line, or may be coupled to a conducting medium which surrounds the processing liquid delivery line and distributes the non-thermal energy along the processing liquid delivery line to facilitate uniform/non-localized desorption. In a preferred embodiment, when ultrasonic energy is employed, a sheath surrounds the processing liquid delivery line, and the conducting medium (e.g., a liquid or a gel) fills a space between the processing liquid delivery line and the sheath.

When electromagnetic energy is employed as the non-thermal energy, the electromagnetic energy source preferably is supplied with a frequency adjuster, and the frequency of the electromagnetic energy is adjusted to match the vibrational frequency of the absorbed processing liquid molecules.

The present invention thus provides an effective and inexpensive method and apparatus for desorbing processing liquid from a processing liquid delivery line. Because non-thermal energy is employed, heating of processing liquids is minimized so that processing liquids do not decompose, and rubber components need not be specially designed for high temperature exposures. Further, it is believed that the present invention will reduce processing liquid desorption times as compared to prior art methods.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 2:
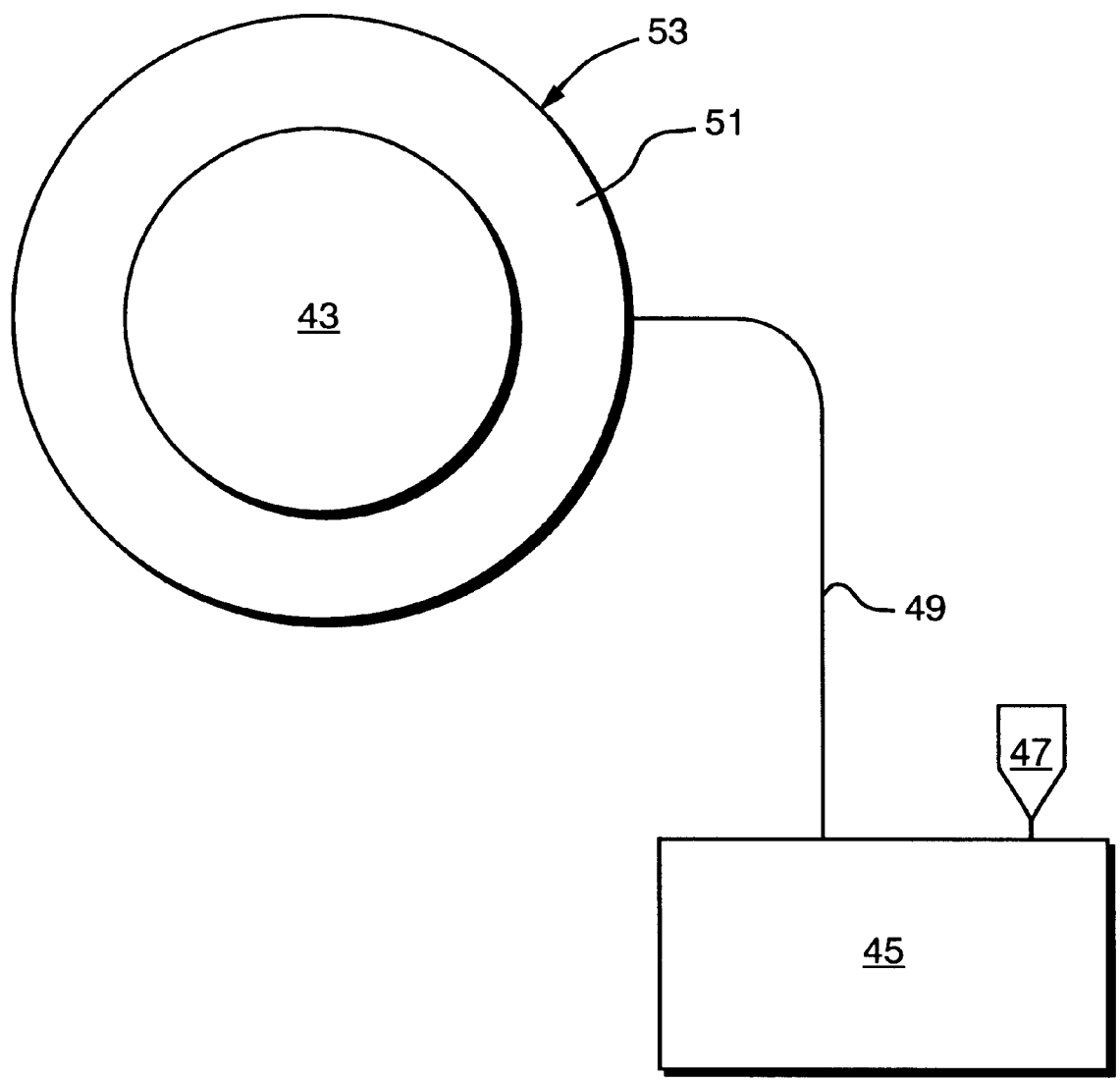
FIG. 2 is a front cross sectional view of an inventive processing liquid delivery line.

FIG. 2 is a front cross sectional view of an inventive processing liquid delivery system 41. The processing liquid delivery system 41 comprises a processing liquid delivery line 43 and a source of non-thermal energy 45 operatively coupled to the processing liquid delivery line 43. The source of non-thermal energy 45 may generate any type of non-thermal energy which affects desorption of processing liquid from the walls of the processing liquid delivery line 43, such as ultrasonic energy or electromagnetic energy.

A frequency adjuster 47 optionally may be coupled to the source of non-thermal energy 45 to adjust the frequency thereof (e.g., when the source of non-thermal energy is an electromagnetic energy source). Specifically, the optional frequency adjuster 47 enables the electromagnetic frequency output by the source of non-thermal energy 45 to be adjusted to match the frequency at which the absorbed molecules of processing liquid vibrate. Due to resonance effects, electromagnetic energy thereby is very efficiently transferred to the processing liquid.

The source of non-thermal energy 45 is operatively coupled to the processing liquid delivery line 43 (e.g., one or more leads 49) either directly, or indirectly via a conducting medium 51. Preferably, if the non-thermal energy source 45 is an ultrasonic energy source, the processing liquid delivery line 43 further comprises a sheath 53 which surrounds the outer surface of the processing liquid delivery line 43, in a spaced relationship therewith. The conducting medium 51 fills the space between the processing liquid delivery line 43 and the sheath 53, and comprises a material (e.g., a gel or liquid) which readily transmits the non-thermal energy so as to distribute the non-thermal energy along the length of the conducting medium 51. Thus non-thermal energy also is distributed along the length of the processing liquid delivery line 43, preventing localized desorption.

When the source of non-thermal energy 45 is an ultrasound generator, the conducting medium 51 is a sound conducting medium. When the source of non-thermal energy 45 is an electromagnetic energy source (e.g., an RF source, a microwave source, etc.), the electromagnetic energy source may be coupled directly to the processing liquid delivery line 43 if desired, with the processing liquid delivery line 43 itself serving as the conducting medium (e.g., because the line 43 typically is a metal). The operation of the inventive processing liquid delivery line 43 is described below with reference to FIG. 3.

Figure 1:
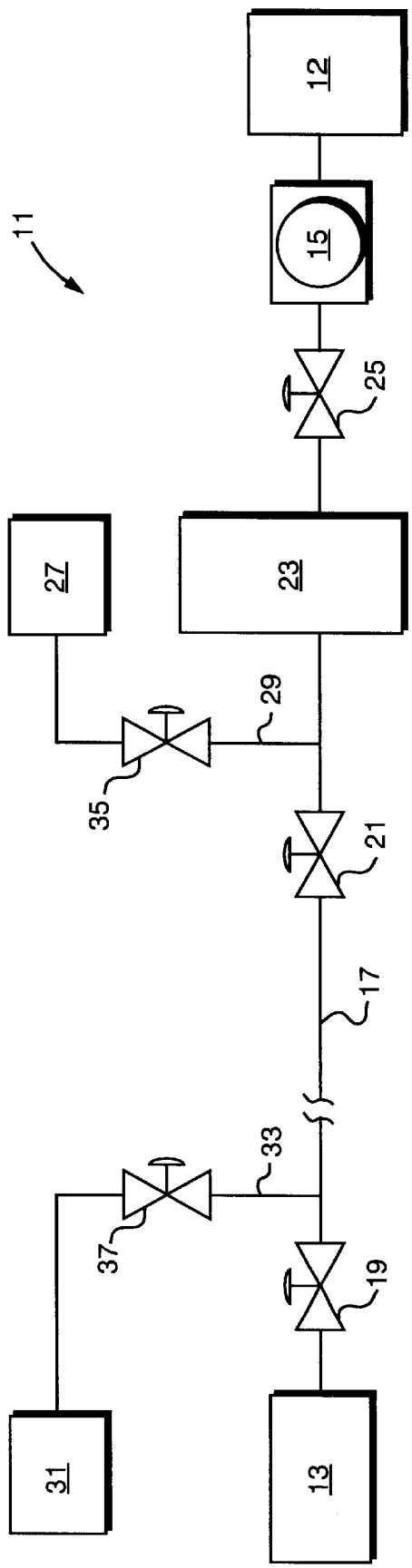
FIG. 1 is a diagrammatic side elevational view of a conventional processing liquid delivery system, as previously described.
Figure 3:
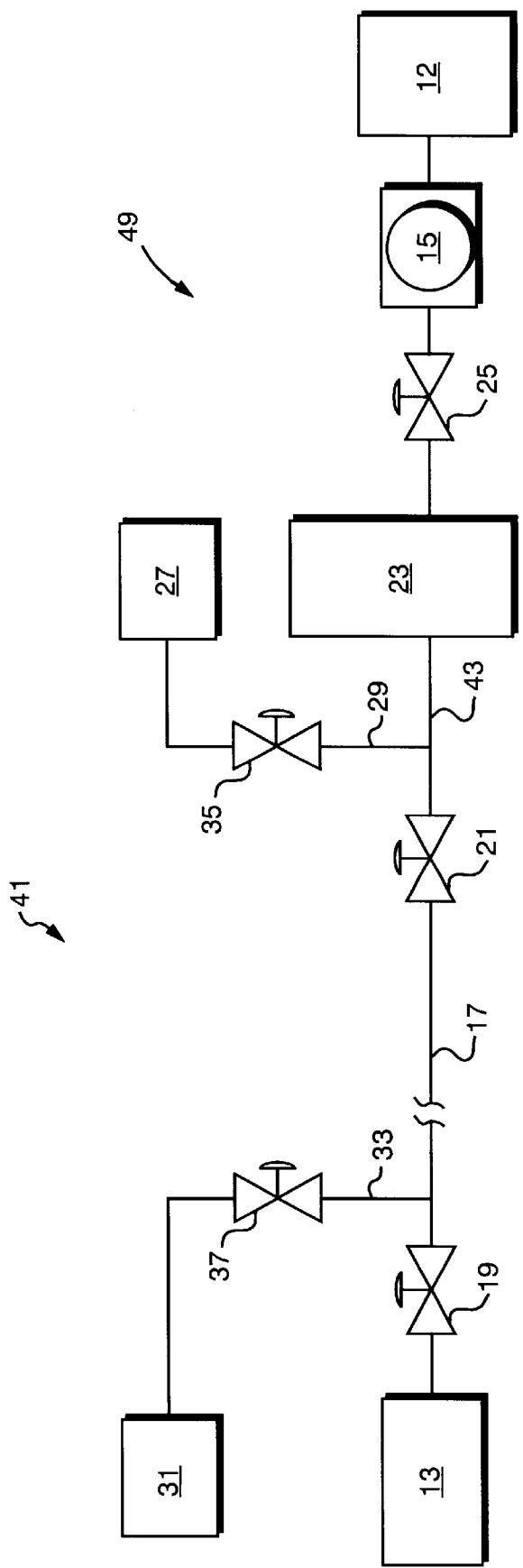
FIG. 3 is a diagrammatic side elevational view of a processing liquid delivery system similar to that of FIG. 1, but employing the inventive processing liquid delivery line of FIG. 2.

FIG. 3 is a diagrammatic side elevational view of a processing liquid delivery system 49 similar to that of FIG. 1, but employing the processing liquid delivery line 43 of FIG. 2. Only those aspects which differ from the conventional processing liquid delivery system 11 of FIG. 1 are described. Specifically, as shown in FIG. 3, that portion of the processing line which is exposed (i.e., not sealed from the external environment) during replacement of a malfunctioning liquid flow meter 23, or during replacement of a malfunctioning injection valve 15 comprises the inventive processing liquid delivery line 43 of FIG. 2.

In operation, in order to repair or replace the liquid flow meter 23 or the injection valve 15, the first isolation valve 19 is closed and, while the second isolation valve 21 and the third isolation valve 25 remain open, the purge valve 35 and the pump valve 37 are opened. Purging gas thereby flows from the source of purging gas 27, through the purging gas line 29, through the processing liquid delivery line 17 and through the pump line 33 to the pump 31. The purging gas dislodges processing liquid particles from the surfaces of the processing liquid delivery line 17, and the dislodged particles and that portion of the processing liquid which is not absorbed by the walls of the processing liquid delivery line 43, are pumped from both the conventional portion 17 of the processing liquid delivery line, and the inventive portion 43 of the processing liquid delivery line. Thereafter, the source of non-thermal energy 45 is engaged and non-thermal energy (e.g., ultrasound waves, electromagnetic waves, etc.) is transmitted from the source of non-thermal energy 45 to the processing liquid delivery line 43.

If ultrasonic energy is employed, the non-thermal energy preferably is transmitted from the source 45 to the sheath 53 via the lead 49. The conducting medium 51 distributes the non-thermal energy along the entire outer surface of the processing liquid delivery line 43. The non-thermal energy vibrates the walls of the processing liquid delivery line 43, and processing liquid absorbed by the walls of the processing liquid delivery line 43 is energized by the non-thermal energy and is desorbed from the processing liquid delivery line 43. If electromagnetic energy is employed, the non-thermal energy preferably is directly transmitted from the source 45 to the processing liquid delivery line 43. The processing liquid delivery line 43 itself may serve as the conducting medium 51 and distribute the non-thermal, electromagnetic energy along the entire outer surface of the processing liquid delivery line 43. The frequency of the electromagnetic energy is tuned to the vibrational frequency of the processing liquid, and processing liquid absorbed by the walls of the processing liquid delivery line 43 is energized by the electromagnetic energy and is desorbed from the processing liquid delivery line 43.

Preferably, while the source of non-thermal energy 45 is engaged, the pumping and purging process described with reference to FIG. 1 is performed to remove processing liquid which desorbs from the walls of the processing liquid delivery line 17. The number and length of pump/purge cycles depends on the distance to the pump and the length of the processing liquid delivery line 43 from which processing liquid must be desorbed.

The foregoing description discloses only the preferred embodiments of the invention, modifications of the above disclosed apparatus and method which fall within the scope of the invention will be readily apparent to those of ordinary skill in the art. For instance, the configuration of the processing liquid delivery system of FIG. 3 is merely exemplary. The inventive processing liquid delivery line may be used in any liquid delivery system. Similarly, the purging process described with reference to FIG. 3 is merely exemplary. The non-thermal energy may be employed during or between pumping and purging cycles. Further, other sources of non-thermal energy may be employed (e.g., megasonic).

Accordingly, while the present invention has been disclosed in connection with the preferred embodiments thereof, it should be understood that other embodiments may fall within the spirit and scope of the invention, as defined by the following claims.

The invention claimed is:

1. A system configured to purge processing liquid from a processing liquid delivery line, the system comprising:
   a processing liquid delivery line configured to deliver processing liquid to a processing chamber while a semiconductor process is performed within the processing chamber;
   a pump coupled to the processing liquid delivery line; and
   a source of non-thermal energy operatively coupled to the processing liquid delivery line and configured to transmit non-thermal energy from the source to the processing liquid delivery line, the non-thermal energy being configured so as to affect desorption of processing liquid from the processing liquid delivery line.

2. The apparatus of claim 1 wherein the source of non-thermal energy is a source of ultrasonic energy.

3. The apparatus of claim 1 wherein the source of non-thermal energy is a source of electromagnetic energy.

4. The apparatus of claim 3 further comprising a frequency adjuster coupled to the source of electromagnetic energy adapted to adjust the frequency of the electromagnetic energy transmitted from the source to the vibrational frequency of processing liquid absorbed by the processing liquid delivery line.

5. The apparatus of claim 1 further comprising a conducting medium coupled between the processing liquid delivery line and the source of non-thermal energy.

6. The apparatus of claim 5 wherein the conducting medium extends around the exterior surface of the processing liquid delivery line.

7. The apparatus of claim 5 wherein the source of non-thermal energy is a source of electromagnetic energy.

8. The apparatus of claim 7 further comprising a frequency adjuster coupled to the source of electromagnetic energy adapted to adjust the frequency of the electromagnetic energy transmitted from the source to the vibrational frequency of processing liquid absorbed by the processing liquid delivery line.

9. The apparatus of claim 1 further comprising a sheath which surrounds the exterior surface of the processing liquid delivery line; and a conducting medium which fills the region between the sheath and the exterior surface of the processing liquid delivery line so as to couple non-thermal energy to the exterior surface of the processing liquid delivery line.

10. The apparatus of claim 9 wherein the source of non-thermal energy is a source of ultrasonic energy.

11. A processing system comprising:
    a processing chamber;
    a processing liquid delivery line configured to deliver processing liquid to the processing chamber while a semiconductor process is performed within the processing chamber;
    a pump coupled to the processing liquid delivery line; and
    a source of non-thermal energy operatively coupled to the processing liquid delivery line and configured to transmit non-thermal energy from the source to the processing liquid delivery line, the non-thermal energy being configured so as to affect desorption of processing liquid from the processing liquid delivery line.

12. A processing system comprising:

a processing chamber;

a processing liquid delivery line configured to deliver processing liquid to the processing chamber while a semiconductor process is performed within the processing chamber;

a pump coupled to the processing liquid delivery line;

a sheath which surrounds an exterior surface of the processing liquid delivery line;

a conducting medium which fills a region between the sheath and the exterior surface of the processing liquid delivery line; and a source of non-thermal energy coupled to the sheath so as to couple non-thermal energy to the exterior surface of the processing liquid delivery line, the non-thermal energy being configured so as to affect desorption of processing liquid from the processing liquid delivery line.

13. A system configured to purge processing liquid from a processing liquid delivery line, the system comprising:

a processing liquid delivery line configured to deliver processing liquid to a processing chamber while a semiconductor process is performed within the processing chamber;

a source of non-thermal energy operatively coupled to the processing liquid delivery line and configured to transmit non-thermal energy from the source to the processing liquid delivery line, the non-thermal energy being configured so as to affect desorption of processing liquid from the processing liquid delivery line; and a frequency adjuster coupled to the source of non-thermal energy and configured to adjust the frequency of the non-thermal energy transmitted from the source of non-thermal energy to a vibrational frequency of processing liquid absorbed by the processing liquid delivery line.

* * * * *